(12) United States Patent
Stave

(10) Patent No.: US 7,574,634 B2
(45) Date of Patent: Aug. 11, 2009

(54) REAL TIME TESTING USING ON DIE TERMINATION (ODT) CIRCUIT

(75) Inventor: Eric J. Stave, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 667 days.

(21) Appl. No.: 10/872,608

(22) Filed: Jun. 21, 2004

(65) Prior Publication Data

US 2005/0283671 A1 Dec. 22, 2005

(51) Int. Cl.
*G01R 31/28* (2006.01)
*G11C 29/00* (2006.01)

(52) U.S. Cl. .................. 714/718; 714/724; 714/712; 714/734; 365/201

(58) Field of Classification Search ........................ None
See application file for complete search history.

(56) References Cited

U.S. PATENT DOCUMENTS

| | | | | |
|---|---|---|---|---|
| 4,435,803 | A * | 3/1984 | Das et al. ................ | 370/228 |
| 6,335,632 | B1 * | 1/2002 | Hui ........................... | 326/30 |
| 6,535,047 | B2 * | 3/2003 | Mughal et al. ............ | 327/378 |
| 6,714,038 | B2 * | 3/2004 | Lee et al. .................. | 326/16 |
| 6,741,095 | B2 * | 5/2004 | Abrosimov et al. ....... | 326/30 |
| 6,762,620 | B2 * | 7/2004 | Jang et al. ................ | 326/30 |
| 6,809,546 | B2 * | 10/2004 | Song et al. ................ | 326/30 |
| 6,842,035 | B2 * | 1/2005 | Kurts et al. ............... | 326/30 |
| 6,859,059 | B2 * | 2/2005 | Rohrbaugh et al. ....... | 324/763 |
| 6,924,660 | B2 * | 8/2005 | Nguyen et al. ............ | 326/30 |
| 7,020,818 | B2 * | 3/2006 | Dour et al. ................ | 714/724 |
| 7,034,565 | B2 * | 4/2006 | Lee ........................... | 326/30 |
| 7,034,567 | B2 * | 4/2006 | Jang ......................... | 326/30 |

(Continued)

OTHER PUBLICATIONS

DDR2, The Next-Generation Synchronous Dram, available at http://www.elpida.com/pdfs/E0294E30.pdf on Mar. 8, 2004, 3 pgs.

(Continued)

*Primary Examiner*—John P Trimmings
*Assistant Examiner*—Guerrier Merant
(74) *Attorney, Agent, or Firm*—Jones Day; Edward L. Pencoske

(57) ABSTRACT

A system and method to operate an electronic device, such as a memory chip, in a test mode using the device's built-in ODT (on die termination) circuit is disclosed. One or more test mode related signals, which include on-die signals and other relevant information, may be transferred from the integrated circuit of the electronic device to an external processor using the device's ODT circuit instead of the output data signal driver circuit. Therefore, no capacitive loading of output drivers occurs during test mode operations. Thus the speed of the output data path (i.e., the circuit path propagating non-test mode related signals from the electronic device to other external units in the system) is not affected by test mode operations, allowing a system designer to increase the speed of the data output path as much as desired. Further, deterioration in the quality of signals output from the output drivers is also avoided. Also, the use of a minimal number of logic gates along with the existing ODT circuits to perform transmission of test mode related signals substantially maximizes chip real estate utilization without waste. Because of the rules governing abstracts, this abstract should not be used to construe the claims.

28 Claims, 4 Drawing Sheets

U.S. PATENT DOCUMENTS

| | | | |
|---|---|---|---|
| 7,092,299 B2 * | 8/2006 | Kwak et al. | 365/198 |
| 7,151,390 B2 * | 12/2006 | Nguyen et al. | 326/30 |
| 7,170,313 B2 * | 1/2007 | Shin | 326/30 |
| 7,227,377 B2 * | 6/2007 | Kurts et al. | 326/30 |
| 7,239,560 B2 * | 7/2007 | Lee et al. | 365/189.05 |
| 7,245,140 B2 | 7/2007 | Sunwoo et al. | |
| 2002/0188898 A1 * | 12/2002 | Tsuji | 714/718 |
| 2004/0141391 A1 * | 7/2004 | Lee et al. | 365/200 |
| 2006/0262604 A1 * | 11/2006 | Johnson | 365/185.24 |
| 2007/0113209 A1 * | 5/2007 | Park et al. | 716/4 |

OTHER PUBLICATIONS designline, vol. 12, Issue 2, available at ://download.micron.com/pdf/pubs/designline/dl3Q03.pdf on Mar. 8, 2004, 16 pgs.

Micron/On-Die Termination/Thermal Considerations TN-44-02 available at http://download.micron.com/pdf/technotes/TN4402.pdf on Mar. 8, 2004, 7 pgs.

DRAM Memory System: Lecture 12, available at http://www.ee.umd.edu/courses/enee759h.S2003/lectures/Lecture12.pdf on Mar. 8, 2004, 17 pgs.

* cited by examiner

REAL TIME TESTING USING ON DIE TERMINATION (ODT) CIRCUIT

BACKGROUND

1. Field of the Disclosure

The present disclosure generally relates to testing of electronic devices and, more particularly, to a system and method to test semiconductor memory chips.

2. Brief Description of Related Art

Memory devices are widely used in many electronic products and computers to store data. A memory device is a semiconductor electronic device that includes a number of memory cells, each cell storing one bit of data. The data stored in the memory cells can be read during a read operation. FIG. 1 is a simplified block diagram showing a memory chip or memory device 12. The memory chip 12 may be part of a DIMM (dual in-line memory module) or a PCB (printed circuit board) containing many such memory chips (not shown in FIG. 1). The memory chip 12 may include a plurality of pins 24 located outside of chip 12 for electrically connecting the chip 12 to other system devices. Some of those pins 24 may constitute memory address pins or address bus 17, data (DQ) pins or data bus 18, and control pins or control bus 19. It is evident that each of the reference numerals 17-19 designates more than one pin in the corresponding bus. Further, it is understood that the schematic in FIG. 1 is for illustration only. That is, the pin arrangement or configuration in a typical memory chip may not be in the form shown in FIG. 1.

A processor or memory controller (not shown) may communicate with the chip 12 and perform memory read/write operations. The processor and the memory chip 12 may communicate using address signals on the address lines or address bus 17, data signals on the data lines or data bus 18, and control signals (e.g., a row address select (RAS) signal, a column address select (CAS) signal, etc. (not shown)) on the control lines or control bus 19. The "width" (i.e., number of pins) of address, data and control buses may differ from one memory configuration to another.

Those of ordinary skill in the art will readily recognize that memory chip 12 of FIG. 1 is simplified to illustrate one embodiment of a memory chip and is not intended to be a detailed illustration of all of the features of a typical memory chip. Numerous peripheral devices or circuits may be typically provided along with the memory chip 12 for writing data to and reading data from the memory cells 26. However, these peripheral devices or circuits are not shown in FIG. 1 for the sake of clarity.

The memory chip 12 may include a plurality of memory cells 26 generally arranged in rows and columns to store data in rows and columns. A row decode circuit 28 and a column decode circuit 30 may select the rows and columns in the memory cells 26 in response to decoding an address, provided on the address bus 17. Data to/from the memory cells 26 is then transferred over the data bus 18 via sense amplifiers and a data output path (not shown). A memory controller (not shown) may provide relevant control signals (not shown) on the control bus 19 to control data communication to and from the memory chip 12 via an I/O (input/output) circuit 36. The I/O circuit 36 may include a number of data output buffers to receive the data bits from the memory cells 26 and provide those data bits or data signals to the corresponding data lines in the data bus 18. An exemplary I/O circuit is discussed below with reference to FIG. 2.

The memory controller (not shown) may determine the modes of operation of memory chip 12. Some examples of the input signals or control signals (not shown in FIG. 1) on the control bus 19 include an External Clock signal, a Chip Select signal, a Row Access Strobe signal, a Column Access Strobe signal, a Write Enable signal, etc. The memory chip 12 communicates to other devices connected thereto via the pins 24 on the chip 12. These pins, as mentioned before, may be connected to appropriate address, data and control lines to carry out data transfer (i.e., data transmission and reception) operations.

A test mode control unit 34 is also illustrated as part of the memory chip 12. The test mode control unit 34 may include digital logic such as, for example, one or more test mode registers to perform testing of the memory chip 12 to obtain information about various signals generated within the chip 12 as discussed later. A memory controller (not shown) may instruct the control unit 34 to supply the requested test mode related signal information from the chip 12.

FIG. 2 is a simplified diagram illustrating a portion of the I/O circuit 36 in the memory chip 12 shown in FIG. 1. The I/O circuit 36 is shown to include two signal processing circuits—an output driver unit 38, and an ODT (on die termination) circuit 40. Both of these signal processing circuits are shown connected to the data (DQ) pins 18 of the memory chip 12. The output driver 38 is shown to be directly connected to an external clock pin 42 (which is one of the pins 24 on the chip 12) to receive an output enable signal therethrough. However, in practice, there may be additional intervening circuits between the clock pin 42 and the output driver 38 to generate appropriate output enable signal to be supplied to the driver 38. The driver 38 also receives the data signals (DQ Out) 43 from the memory cells 26 to be output on the DQ pins 18 (e.g., during a memory read operation). Thus, the DQ Out signals 43 are generated internally within the chip 12 as shown in FIG. 2.

FIG. 3 illustrates an exemplary circuit layout of the output driver circuit 38. As is known in the art and as can be seen from FIG. 3, the DQ Out 43 signals are sent to the DQ pins 18 via the output driver 38 when the output enable signal 42 is active (e.g., active "high" in the implementation of FIG. 3). Once enabled, the output driver 38 provides necessary signal amplification and buffering to the data signals to be sent from the memory cells 26 to the DQ pins 18. There may be more than one output driver 38 in the memory chip 12—one output driver 38 for each data line 18. Each output driver 38 may have an IC (integrated circuit) output pad 46 to convey the data signals to the corresponding DQ pins 18 as is known in the art. It is noted here that, for the sake of simplicity, the reference numeral "42" is used to interchangeably refer to the clock pin and the output enable signal. In practice, the clock input at pin 42 may not directly be used as the output enable signal, but may get processed through intervening digital logic (not shown) to obtain the output enable signal as is known in the art.

Referring again to FIG. 2, it is seen that the I/O circuit may also include the on-chip ODT circuit 40 to improve signal integrity in the system. An ODT pin 44 (one of the pins 24 on the chip 12) may be provided on the chip to receive an externally-supplied (e.g., by a memory controller) ODT enable signal to activate the ODT circuit 40. Although the ODT circuit 40 in FIG. 2 is shown connected to the DQ pins 18, in practice, corresponding ODT circuits 40 may be provided for any other pins on the chip 12 including, for example, the address pins 17 and the control pins 19. The ODT circuit 40 may be more prevalent in DDR (Double Data Rate) SDRAMs (Synchronous Dynamic Random Access Memories).

In operation, the ODT circuit 40 provides desired termination impedance to improve signal integrity by controlling reflected noise on the transfer line connecting the memory chip 12 to another processing device, e.g., a memory controller (not shown). In a DDR SDRAM, the termination register (not shown) that was conventionally mounted on a motherboard carrying memory chips is incorporated inside the DDR SDRAM chip (e.g., as part of the test mode control unit 34) to enable or disable the ODT circuit 40 when desired. The termination register may be programmed through the ODT pin 44 by an external processor (e.g., a memory controller) to enable/disable the ODT circuit 40. As is known in the art, for example, when two memory chips 12 are loaded in a system, then during a memory write operation to one of the chips 12, the ODT circuit 40 in the other chip (which is not receiving data) is activated to absorb any signal propagations or reflections received on the data lines 18 (or address or control lines) of that "inactive" chip. This selective activation/deactivation of the ODT circuit 40 (e.g., in the memory chip that is not currently sending or receiving data) prevents the "inactive" chip from receiving spurious signals, thereby avoiding data corruption in the chip. The ODT circuit 40 thus improves signal (e.g., data signals) integrity in the memory chip 12.

FIG. 4 depicts an exemplary circuit diagram of the ODT circuit 40. The ODT circuit 40 may include two identical termination resistors $R_T$ 48-49 whose values may be adjusted (e.g., by the external memory controller (not shown) through programming of the termination register (not shown)) depending on the desired termination. Thus, the termination resistors $R_T$ 48-49 may not be strictly passive, fixed-value resistors. It is known that the termination value of $R_T$ 48-49 may be equal to the Thevenin equivalent of the resistors that terminate the DQ pins 18 at the IC output pad 52. The ODT circuit 40 may also include two switching elements—the "pull-up" n-channel CMOS transistor 50 and the "pull-down" n-channel CMOS transistor 51. Proper biasing for the ODT circuit 40 may be provided as indicated and as is known in the art. As mentioned earlier, the ODT circuit 40 is activated when the ODT Enable signal 44 goes "high" (in the implementation of FIG. 4) and deactivated when the signal 44 is in the "low" state. It is observed that, for the sake of simplicity, the reference numeral "44" is used to interchangeably refer to the ODT pin and the ODT Enable signal. In practice, the signal received on the ODT pin may be processed by intervening logic circuitry (not shown) to generate the desired ODT Enable signal.

FIG. 5 shows an exemplary block diagram illustrating how a test mode related signal 56 is traditionally output to the DQ pins 18 of the memory 12 in FIG. 1. In the discussion hereinbelow, the term "test mode related signal" is used to refer to any signal present on chip or on the die of an electronic device (e.g., the memory chip 12) and which is desired to be monitored by an external controller (e.g., a processor or memory controller (not shown)) during testing of the operation of the electronic device. For convenience, such signal is referred to by letter "A" in the discussion below. It is noted here that the information transfer during the testing operation is distinct from and may not be part of the routine data transfer during typical memory read/write operations. The test mode related signals 56 may include various data outputs (DQ Out 43), output from one or more redundant elements on the chip 12 (e.g., a redundant row of memory cells to replace a current row of memory cells when one or more cells in the current row are defective, or a redundant column of memory cells, etc.), signals generated by a DLL (delay locked loop) or other clock generation circuits on the chip, various control signals such as shift left (SL), shift right (SR), Reset, DLL coarse shift, DLL fine shift, etc. These signals may need to be monitored in the event of a malfunction of the chip 12, to debug the chip functionality or to ascertain operational defects in the chip 12 during testing of the chip.

Traditionally, a test mode related signal 56 is output over DQ pins 18 to an "inquiring" device (e.g., the test processor or memory controller (not shown)) via the corresponding output driver circuit 38 as shown in FIG. 5. The test processor or memory controller (not shown) may instruct the test mode control unit 34 to enable the output driver 38 to propagate appropriate signal "A" to the data output pins 18. Although circuit details of such test mode signal transfers in FIG. 5 are not shown here, it is observed that one or more signals from the control unit 34 and the signal "A" 56 may be processed through a digital circuit (not shown) prior to being applied to the output driver 38 to be output to the DQ pins 18.

In the arrangement of FIG. 5, to communicate internal chip signals to an outside controller (e.g., a memory controller (not shown)), the use of various corresponding output drivers 38 and testing related circuitry coupled to these drivers 38 results in addition of capacitance to the external pins 24 (e.g., DQ pins 18) through which signals "A" 56 are obtained. Also, such "loading" of output drivers 38 by testing related logic circuitry negatively affects chip performance during routine high speed data transfer operations (e.g., typical memory read/write operations during run time). For example, more gates added to output drivers 38 for testing related circuitry may not only result in additional output delays, but may also cause jitter on output signals and may significantly deteriorate quality of output signals. Furthermore, as clock speed of electronic devices (e.g., memory chips) increases, any addition of test mode-specific output drivers—i.e., output drivers dedicated to transmit only signals "A" 56—as part of the I/O circuit 36 on the chip 12 would result in additional capacitive loading at the DQ pins 18 used for test mode related signal transfers, thereby further affecting the speed with which output can be obtained. The on chip placement of such extra output drivers would also result in unnecessary waste of chip real estate.

Therefore, it is desirable to devise a test mode related signal transfer mechanism that does not add capacitance to output pins and also not affect the output speed path of signals output from the electronic device. It is further desirable to obtain such signal transfer mechanism without significantly adding logic circuitry on the chip real estate.

SUMMARY

The present disclosure contemplates a method of operating an electronic device. The method comprises selecting an on die termination(ODT) circuit in the electronic device; and using only the selected ODT circuit to propagate a test mode related signal from said electronic device.

In one embodiment, the present disclosure contemplates an electronic device that comprises an ODT circuit having two inputs and an output; and a gate circuit coupled to the ODT circuit and configured to supply a test mode related signal to one of the two inputs so as to toggle the output of the ODT circuit in response to the test mode related signal, wherein the test mode related signal includes a signal present in the electronic device to allow testing thereof.

In another embodiment, the present disclosure contemplates a memory device that comprises a plurality of memory cells to store data; and an I/O circuit configured to facilitate a data read/write operation from/to one or more of the plurality of memory cells, wherein the I/O circuit includes an ODT circuit, and a gate circuit coupled to the ODT circuit and configured to input a test mode related signal thereto so as to generate an output signal representative of the test mode related signal at an output of the ODT circuit, wherein the test mode related signal includes a signal present in the memory device to allow testing thereof.

According to a system and method of the present disclosure an electronic device, such as a memory chip, is operated in a test mode using the device's built-in ODT circuit. One or more test mode related signals, which include on-die signals and other relevant information, may be transferred from the integrated circuit of the electronic device to an external processor using the device's ODT circuit instead of the output data signal driver circuit. Therefore, no capacitive loading of output drivers occurs during test mode operations. Thus the speed of the output data path (i.e., the circuit path propagating non-test mode related signals from the electronic device to other external units in the system) is not affected by test mode operations, allowing a system designer to increase the speed of the data output path as much as desired. Also, the use of a minimal number of logic gates along with the existing ODT circuits to perform transmission of test mode related signals substantially maximizes chip real estate utilization without waste.

BRIEF DESCRIPTION OF THE DRAWINGS

For the present disclosure to be easily understood and readily practiced, the present disclosure will now be described for purposes of illustration and not limitation, in connection with the following figures, wherein.

DETAILED DESCRIPTION

Reference will now be made in detail to some embodiments of the present disclosure, examples of which are illustrated in the accompanying drawings. It is to be understood that the figures and descriptions of the present disclosure included herein illustrate and describe elements that are of particular relevance to the present disclosure, while eliminating, for the sake of clarity, other elements found in typical solid-state electronic devices, memories or memory-based systems. It is noted at the outset that the terms "connected", "connecting," "electrically connected," etc., are used interchangeably herein to generally refer to the condition of being electrically connected. It is further noted that various block diagrams and circuit diagrams shown and discussed herein employ logic circuits that implement positive logic, i.e., a high value on a signal is treated as a logic "1" whereas a low value is treated as a logic "0." However, any of the circuit discussed herein may be easily implemented in negative logic (i.e., a high value on a signal is treated as a logic "0" whereas a low value is treated as a logic "1").

Figure 6:
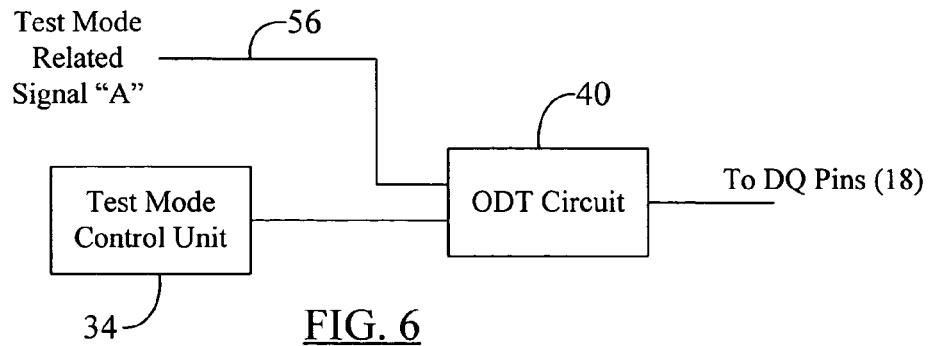
FIG. 6 depicts an exemplary block diagram illustrating how the test mode related signal is output to the DQ pins according to one embodiment of the present disclosure.

FIG. 6 depicts an exemplary block diagram illustrating how the test mode related signal 56 is output to the DQ pins 18 according to one embodiment of the present disclosure. The test mode related signal 56 and a test mode enable signal (discussed later with reference to FIG. 7) are input to the ODT circuit 40, which transfers the signal "A" 56 to the DQ pins 18. Thus, instead of loading the output driver 38 in the I/O unit 36, the methodology of the present disclosure uses the already existing ODT circuit 40 in the I/O unit 36 to perform the signal transfer operation. It is noted here that the inputs to the ODT circuit 40 may not be supplied directly from the respective sources, but may be supplied through a gate circuit (discussed below with reference to FIG. 7) to accommodate various signals associated with the ODT circuit 40 without substantially adding additional logic circuits or increasing chip real estate. It is observed that only the ODT circuit 40 is used to propagate the test mode related signal 56 to the data output pins 18, without using any portion of the output driver circuit 38. In one embodiment, the ODT circuit 40 may form a part of the output driver 38, however, in that case, only the ODT circuit 40 portion of the output driver 38 will be used to output test mode related signals 56.

Figure 2:
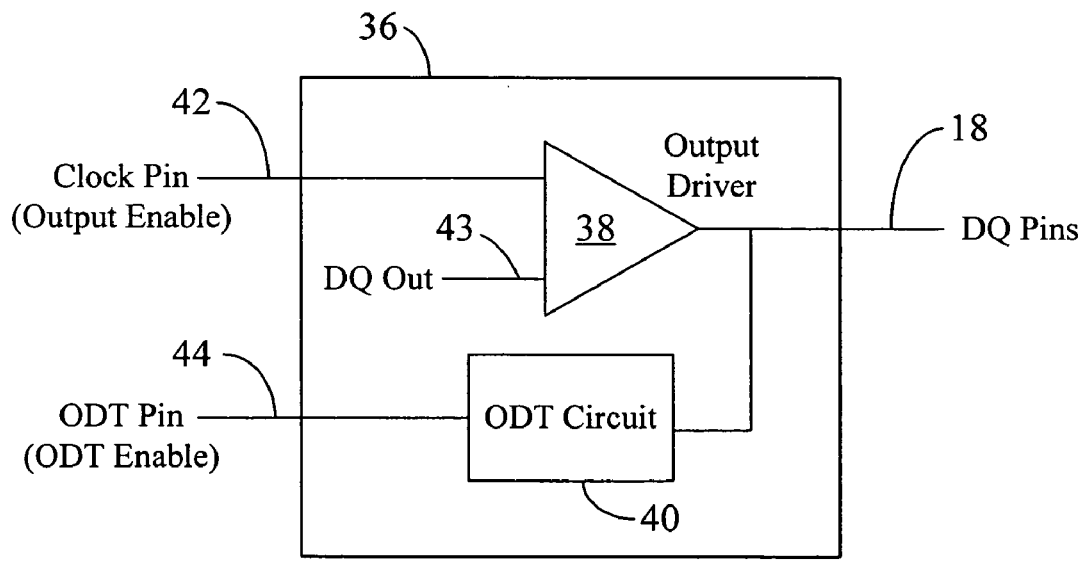
FIG. 2 is a simplified diagram illustrating a portion of the I/O circuit in the memory chip shown in FIG. 1.
Figure 3:
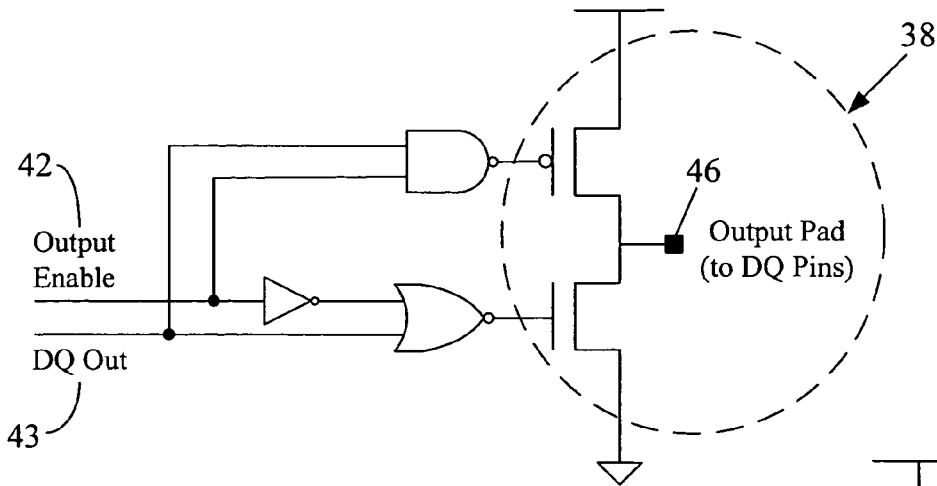
FIG. 3 illustrates an exemplary circuit layout of the output driver circuit shown in FIG. 2.
Figure 4:
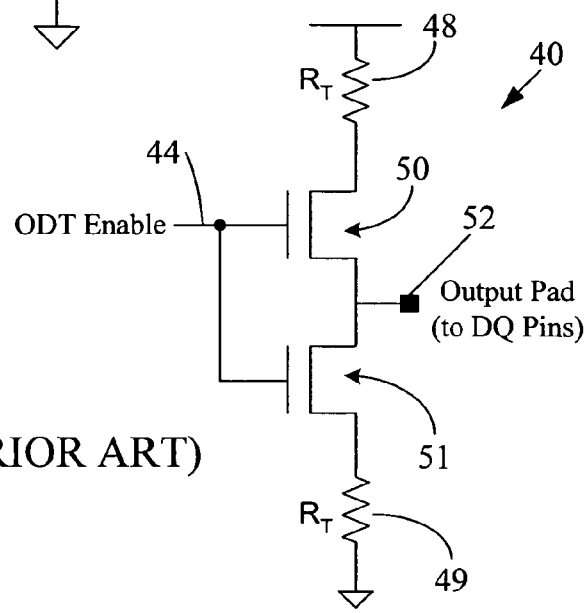
FIG. 4 depicts an exemplary circuit diagram of the ODT circuit shown in FIG. 2.
Figure 5:
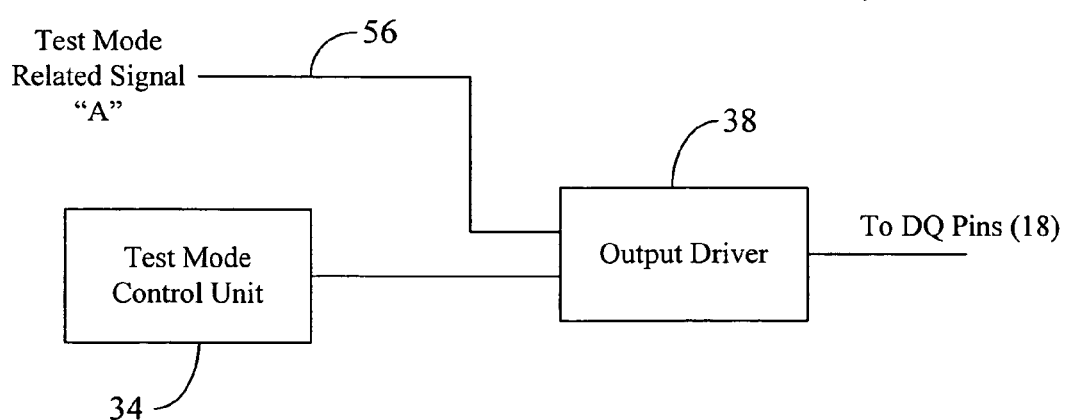
FIG. 5 shows an exemplary block diagram illustrating how a test mode related signal is traditionally output to the DQ pins of the memory in FIG. 1.
Figure 7:
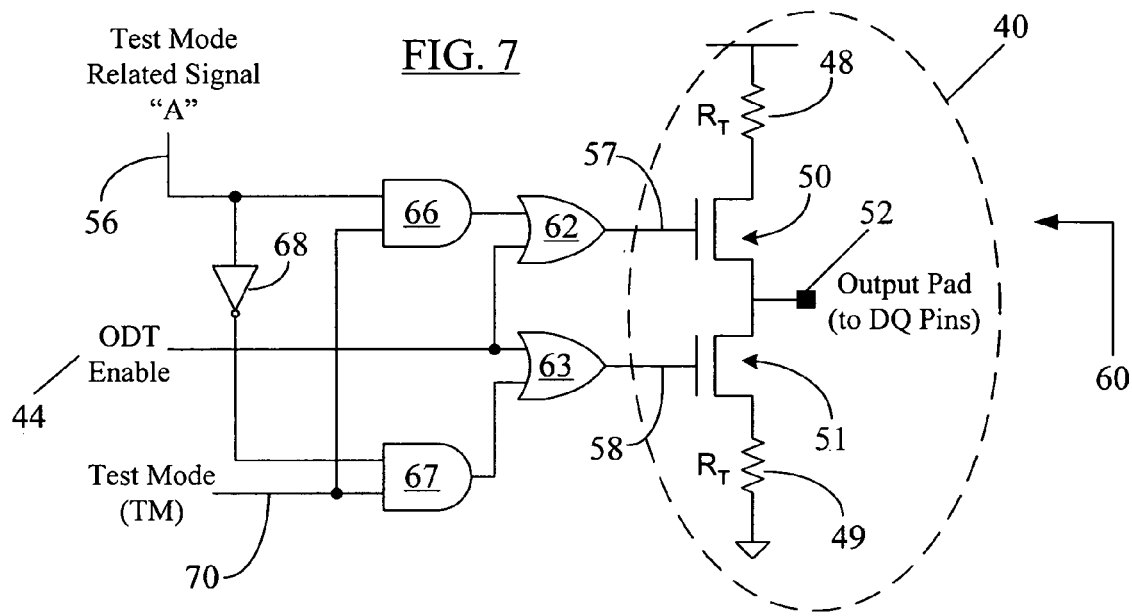
FIG. 7 illustrates an exemplary circuit configuration for the test mode signal transfer block diagram illustrated in FIG. 6.

FIG. 7 illustrates an exemplary circuit configuration 60 for the test mode signal transfer block diagram illustrated in FIG. 6. The ODT circuit 40 (similar to that shown in FIG. 4) is shown to have its two inputs 57-58 connected to a gate circuit that includes two OR gates 62-63, two AND gates 66-67, and an inverter 68. Three signals are input to the gate circuit—the test mode related signal 56, the ODT enable signal 44 (also shown in FIGS. 2 and 4), and a test mode enable (TM) signal 70. The IC output pad 52 of the ODT circuit 40 may connect to the DQ pins 18 as shown in FIG. 7. However, as noted before, it is observed that non-data related pins (e.g., address pins 17, control pins 19, or any other pins from the set of pins 24) may also have ODT circuit 40 connected thereto for proper termination of unwanted or reflected signals in the system in operation. Thus, one or more of those non-data related pins may be used instead of or along with the DQ pins 18 to obtain the test mode related signal 56. In that event, the ODT circuit(s) 40 associated with those non-data related pins may be used to propagate the on-chip signal "A" 56 out of the chip 12. Therefore, in such configuration, the output pad 52 of the ODT circuit 40 may connect to other non-data related pins (not shown in FIG. 7). It is further observed that more than one ODT circuit 40 may be used to transfer different test mode related signals 56 over different pins 24 with which those ODT circuits 40 are associated.

The test mode enable (TM) signal 70 may be supplied by the test mode control unit 34. In one embodiment, the TM signal 70 is a user-controlled signal generated internally within the chip 12 by appropriate programming of one or more test mode registers (not shown) in the control unit 34. The programming of the test mode register(s) may be carried out by an external processor (e.g., a memory controller 80 shown in FIG. 8) using one or more address 17 and/or control lines 19. For example, output of the DLL clock may be designated as "Test Mode-1", the output of a DLL coarse shift left signal may be designated as "Test Mode-2", etc., and corresponding test mode register locations may be programmed to identify these test modes when requested by the external processor. Alternatively, the test mode control unit 34 may be pre-programmed during memory fabrication, however, that programming may be changed later during testing using proper commands from the external processor. Thus, in the embodiment of FIG. 7, the TM signal 70 is generated by the test mode control unit 34 when appropriate test mode—i.e., a test mode that is recognized by the control unit 34 either through the information already stored therein or provided by the external processor—is requested by the external processor using, for example, one or more of address 17 and/or control lines 19. Therefore, the generation of the TM signal 70 is user-controlled in the sense that a user may externally control (e.g., using a test processor or memory controller) when the chip 12 should enter the test mode and, hence, when the test mode control unit 34 should commence supplying the test mode enable signals.

Upon activation and upon receipt proper test mode request from the external processor, the test mode control unit 34 may raise the normally low TM signal 70 (FIG. 7) to high or logic "1" state. Thus, it is seen from the embodiment in FIG. 7, that the TM signal 70 acts as a gating signal to gate the test mode related signal 56 to appropriate "leg" of the ODT circuit 40. In FIG. 7, the transistor 50 and resistor 48 may be considered to form the "pull up leg" of the ODT circuit 40, whereas the transistor 51 and resistor 49 may be considered to form the "pull down leg" of the ODT circuit 40. During test mode, the TM signal 70 remains high, whereas the ODT Enable signal 44 remains low to allow propagation of signal "A" 56 outside of the device through the appropriate leg of the ODT circuit 40. The output signal appearing at the pad 52 is thus related to the signal "A" 56, which toggles individual legs of the ODT circuit 40 depending on whether signal "A" is high or low as can be seen from the circuit layout 60 in FIG. 7. For example, when signal "A" 56 is high, it will turn on the transistor 50 but turn off transistor 51, thus the output at the pad 52 will be "pulled up" or high because of the activation of the pull-up leg of the ODT circuit 40. On the other hand, when the signal "A" 56 goes low, it will instead turn on transistor 51 and, hence, it will propagate to the output pad 52 as a low output signal via the pull-down leg of the ODT circuit 40. Thus, the test mode related signal 56 will toggle the ODT circuit 40 when test mode is asserted by raising the TM signal 70 to the high state.

The ODT Enable signal 44 is held normally low. However, because the ODT circuit 40 is used in FIG. 7 in a shared manner for test mode signal propagation as well as for routine signal termination applications, when a signal termination application is desired, the ODT Enable signal 44 (supplied through the ODT pin 44) may be raised high or in logic "1" state to activate both of the transistors 50-51 in the ODT circuit 40 for external signal absorption and termination. When the ODT Enable signal 44 is high, the test mode may not be performed because the values of the TM signal 70 and signal "A" 56 are immaterial because these values do not affect the operation of the ODT circuit 40. Therefore, it may be preferable to not to perform testing while the ODT Enable signal 44 is active.

It is seen from the configuration in FIGS. 6-7 that, in one embodiment, the testing may take place simultaneously or together with data transfer from memory cells 26 because the output driver 38 is no longer shared for the testing operation. Thus, the ODT circuit 40 may transfer signals "A" 56 to appropriate output pins 24 whereas the output driver 38 may simultaneously transfer data signals to DQ pins 18. However, it may be preferable to perform testing when no data transfer activity is present, i.e., when the memory chip 12 is not operated in its routine data read/write mode, but rather exclusively in the test mode.

It is further seen from the configuration in FIGS. 6-7 that the output drivers 38 are not affected by the test mode operations. Therefore, no capacitive loading of output drivers 38 is present in the configuration of FIGS. 6-7. Thus the speed of the output data path (i.e., the circuit path propagating data (DQ) signals to DQ pins 18) is not affected by test mode operations, allowing a system designer to increase the speed of the data output path as much as desired. Also, the use of a minimal number of logic gates along with the existing ODT circuits 40 to perform transmission of test mode related signals (containing on-die information) substantially maximizes chip real estate utilization without wasteful use of chip real estate.

Figure 1:
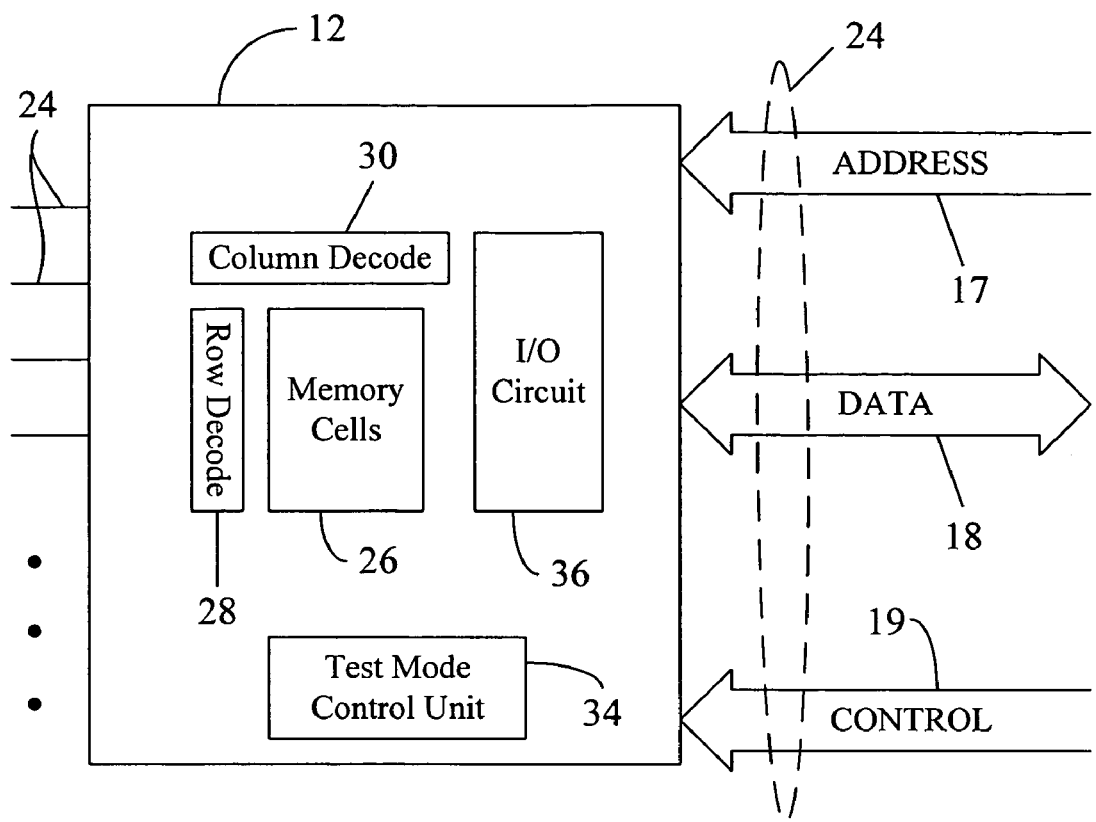
FIG. 1 is a simplified block diagram showing a memory chip or memory device.
Figure 8:
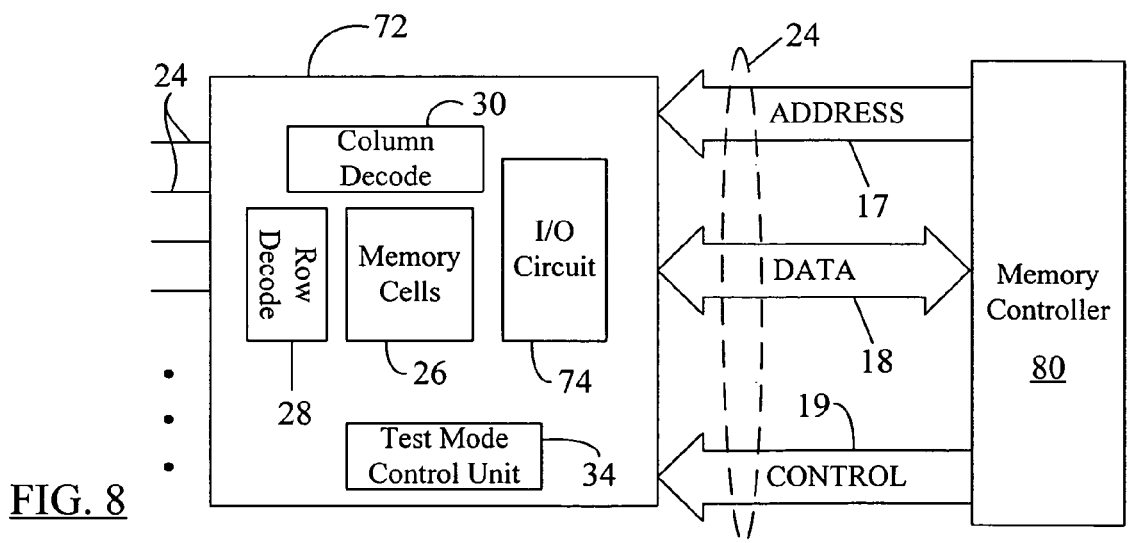
FIG. 8 is a simplified block diagram showing a memory chip in communication with a memory controller, wherein the memory chip employs the test mode signal transfer mechanism illustrated by way of an example in FIG. 6.

FIG. 8 is a simplified block diagram showing a memory chip 72 in communication with a memory controller 80, wherein the memory chip employs the test mode signal transfer mechanism 60 illustrated by way of an example in FIG. 6. The memory chip 72 can be a dynamic random access memory (DRAM) or another type of memory circuits such as SRAM (Static Random Access Memory) or Flash memories. Furthermore, the DRAM could be a synchronous DRAM commonly referred to as SGRAM (Synchronous Graphics Random Access Memory), SDRAM (Synchronous Dynamic Random Access Memory), SDRAM II, or DDR SDRAM (Double Data Rate SDRAM), as well as Synchlink or Rambus DRAMs. The circuit configuration 60 in FIG. 7 may be part of the I/O circuit 74 in the memory chip 72. It is noted here that although other elements in the memory chip 72 are designated with the same reference numerals as those given in FIG. 1, it may be possible that those components having same reference numerals may not be identical in the memories 12 and 72. For example, the test mode control unit 34 in memory chip 72 may be different from the control unit 34 in chip 12 to take into account the new test mode signal transfer mechanism 60 in the I/O circuit 74. However, for the sake of simplicity, units with similar functionality are denoted by same reference numerals in FIGS. 1 and 8.

The memory controller 80 can be a microprocessor, digital signal processor, embedded processor, micro-controller, dedicated memory test chip, a tester platform, or the like. The memory controller 80 may control routine data transfer operations to/from the memory 72, for example, when the memory is part of an operational computing system (not shown). Alternatively or in addition to that configuration, the memory controller 80 may initiate and carryout memory testing using the test mode control unit 34, the I/O unit 74 (i.e., the ODT circuit-based test mode signal transfer mechanism 60 in the I/O unit 74), and one or more of the memory pins 24 as discussed hereinbefore at various places in the present disclosure. The memory controller 80 may reside on the same motherboard (not shown) as that carrying the memory chip 72. Various other configurations of electrical connection between the memory chip 72 and the memory controller 80 may be possible. For example, the memory controller 80 may be a remote entity communicating with the memory chip 72 via a data transfer or communications network (e.g., a LAN (local area network) of computing devices).

Figure 9:
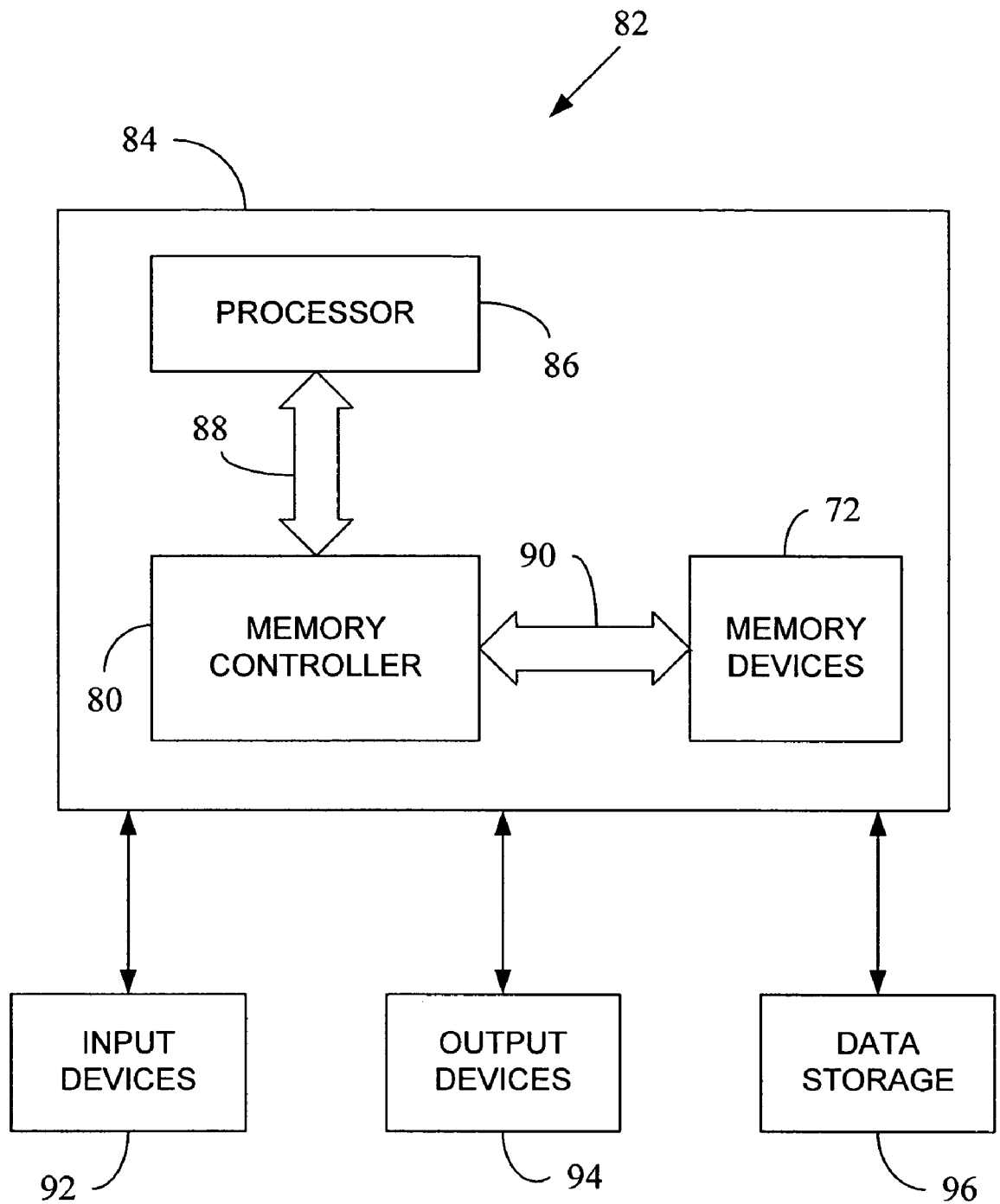
FIG. 9 is a block diagram depicting a system in which one or more memory chips illustrated in FIG. 8 may be used.

FIG. 9 is a block diagram depicting a system 82 in which one or more memory chips 72 illustrated in FIG. 8 may be used. The system 82 may include a data processing unit or computing unit 84 that includes a processor 86 for performing various computing functions, such as executing specific software to perform specific calculations or data processing tasks. The computing unit 84 also includes the memory controller 80 that is in communication with the processor 86 through a bus 88. The bus 88 may include an address bus (not shown), a data bus (not shown), and a control bus (not shown). The memory controller 80 is also in communication with a set of memory devices 72 (i.e., multiple memory chips 72 of the type shown in FIG. 8) through another bus 90. In one embodiment, each memory device 72 is a DDRII DRAM. Each memory device 72 may include appropriate data storage and retrieval circuitry (not shown in FIG. 9) as shown in FIG. 8. The processor 86 can perform a plurality of functions based on information and data stored in the memories 72. The system 82 may include one or more input devices 92 (e.g., a keyboard or a mouse) connected to the computing unit 84 to allow a user to manually input data, instructions, etc., to operate the computing unit 84. One or more output devices 94 connected to the computing unit 84 may also be provided as part of the system 82 to display or otherwise output data generated by the processor 86. Examples of output devices 94 include printers, video terminals or video display units (VDUs). In one embodiment, the system 82 also includes one or more data storage devices 96 connected to the data processing unit 84 to allow the processor 86 to store data in or retrieve data from internal or external storage media (not shown). Examples of typical data storage devices 96 include drives that accept hard and floppy disks, CD-ROMs (compact disk read-only memories), and tape cassettes. As noted before, the memory devices 72 in the computing unit 84 have the configuration illustrated in FIG. 8, i.e., each memory device 72 includes an ODT-based test mode related signal transfer mechanism 60 depicted in FIG. 7.

It is observed that although the discussion given hereinbefore has been primarily with reference to memory devices and test mode related signal transfers in such devices, it is evident that the ODT-based signal transfer mechanism illustrated in FIG. 7 may be employed, with suitable modifications which may be desirable by one skilled in the art to obtain the test mode related signals, in any non-memory electronic device that may need to be tested and that already has a built-in ODT circuit 40 or a similar circuit configuration. Apart from the test mode related signal transfer discussed hereinabove, an ODT circuit in a solid state electronic device may be used to transmit any other signal (whether test mode related or not) out of the device without using an output driver or similar signal output circuit. In this application, the ODT circuit may be used in a manner similar to that discussed hereinbefore with reference to FIG. 7 to transmit an on-chip test mode related signal.

The foregoing describes a system and method to operate an electronic device, such as a memory chip, in a test mode using the device's built-in ODT (on die termination) circuit. One or more test mode related signals, which include on-die signals and other relevant information, may be transferred from the integrated circuit of the electronic device to an external processor using the device's ODT circuit instead of the output data signal driver circuit. Therefore, no capacitive loading of output drivers occurs during test mode operations. Thus the speed of the output data path (i.e., the circuit path propagating non-test mode related signals from the electronic device to other external units in the system) is not affected by test mode operations, allowing a system designer to increase the speed of the data output path as much as desired. Further, deterioration in the quality of signals output from the output drivers is also avoided. Also, the use of a minimal number of logic gates along with the existing ODT circuits to perform transmission of test mode related signals substantially maximizes chip real estate utilization without waste.

While the disclosure has been described in detail and with reference to specific embodiments thereof, it will be apparent to one skilled in the art that various changes and modifications can be made therein without departing from the spirit and scope of the embodiments. Thus, it is intended that the present disclosure cover the modifications and variations of this disclosure provided they come within the scope of the appended claims and their equivalents.

What is claimed is:

1. A method of operating an electronic device, comprising:
   selecting an on die termination (ODT) circuit in said electronic device; and
   using only said selected ODT circuit to propagate a test mode related signal from said electronic device.

2. The method of claim 1, further comprising activating said selected ODT circuit using an externally-supplied enable signal.

3. The method of claim 2, wherein said activating said ODT circuit includes:
   externally generating an enable signal; and
   supplying said enable signal to said ODT circuit in said electronic device.

4. The method of claim 1, wherein said test mode related signal includes a signal present in said electronic device to allow testing.

5. The method of claim 1, wherein said using only said selected ODT circuit includes:
   applying said test mode related signal to a gate circuit coupled to said ODT circuit; and
   gating said test mode related signal through said gate circuit so as to toggle output of said ODT circuit in response to said test mode related signal.

6. The method of claim 5, wherein said gating is performed using a test mode enable signal.

7. The method of claim 1, wherein said using only said selected ODT circuit includes toggling output of said ODT circuit in response to said test mode related signal.

8. The method of claim 1, wherein said using only said selected ODT circuit includes activating a portion of said ODT circuit in response to said test mode related signal so as to propagate said test mode related signal.

9. The method of claim 1, wherein said selecting said ODT circuit includes supplying power to said ODT circuit.

10. The method of claim 1, further comprising transmitting a non-test mode related signal from said electronic device together with said test mode related signal.

11. An electronic device, comprising:
   an on die termination (ODT) circuit having two inputs and an output; and
   a gate circuit coupled to said ODT circuit and configured to supply a test mode related signal to one of said two inputs so as to toggle said output of said ODT circuit in response to said test mode related signal, wherein said ODT circuit is configured to propagate said test mode related signal from said electronic device using only said ODT circuit.

12. The electronic device of claim 11, wherein said ODT circuit includes a pair of active switching devices and a pair of resistors.

13. The electronic device of claim 12, wherein each of said active switching devices is a semiconductor transistor.

14. The electronic device of claim 12, wherein a resistance value of each of said pair of resistors is electronically programmable.

15. The electronic device of claim 11, wherein said gate circuit includes:
   a first input for receiving said test mode related signal;
   a second input for receiving a test mode enable signal to gate said test mode related signal through said gate circuit;

a third input for receiving an ODT enable signal to activate said ODT circuit to perform a signal termination function;

a first output coupled to a first one of said two inputs of said ODT circuit; and a second output coupled to a second one of said two inputs of said ODT circuit.

16. A memory device, comprising:

a plurality of memory cells to store data; and an I/O circuit configured to facilitate a data read/write operation from/to one or more of said plurality of memory cells, wherein said I/O circuit includes:

an on die termination (ODT) circuit, and a gate circuit coupled to said ODT circuit and configured to input a test mode related signal thereto so as to propagate said test mode related signal at an output of said ODT circuit, wherein said ODT circuit is configured to propagate said test mode related signal from said electronic device using only said ODT circuit.

17. The memory device of claim 16, wherein said ODT circuit includes a pair of active switching devices and a pair of resistors.

18. The memory device of claim 17, wherein each of said active switching devices is a semiconductor transistor.

19. The memory device of claim 17, wherein a resistance value of each of said pair of resistors is electronically programmable.

20. The memory device of claim 16, wherein said gate circuit includes:

a first input for receiving said test mode related signal;

a second input for receiving a test mode enable signal to gate said test mode related signal through said gate circuit;

a third input for receiving an ODT enable signal to activate said ODT circuit to perform a signal termination function;

a first output coupled to a first input of said ODT circuit to generate said output signal using a first portion of said ODT circuit; and a second output coupled to a second input of said ODT circuit to generate said output signal using a second portion of said ODT circuit.

21. The memory device of claim 20, further comprising a control unit configured to provide said test mode enable signal to said gate circuit.

22. A system, comprising:

a processor;

a bus; and a memory device coupled to said processor via said bus, wherein said memory device includes:

a plurality of memory cells to store data, and an I/O circuit configured to facilitate a data read/write operation from/to one or more of said plurality of memory cells and said processor via said bus, wherein said I/O circuit includes:

an on die termination (ODT) circuit, and a gate circuit coupled to said ODT circuit and configured to input a test mode related signal thereto so as to propagate said test mode related signal at an output of said ODT circuit, wherein said ODT circuit is configured to propagate said test mode related signal from said electronic device using only said ODT circuit.

23. The system of claim 22, wherein said ODT circuit includes a pair of active switching devices and a pair of resistors.

24. The system of claim 23, wherein each of said active switching devices is a semiconductor transistor.

25. The system of claim 23, wherein a resistance value of each of said pair of resistors is electronically programmable.

26. The system of claim 22, wherein said gate circuit includes:

a first input for receiving said test mode related signal;

a second input for receiving a test mode enable signal to gate said test mode related signal through said gate circuit;

a third input for receiving an ODT enable signal to activate said ODT circuit to perform a signal termination function;

a first output coupled to a first input of said ODT circuit to generate said output signal using a first portion of said ODT circuit; and a second output coupled to a second input of said ODT circuit to generate said output signal using a second portion of said ODT circuit.

27. The system of claim 26, wherein said memory device further comprises a control unit configured to provide said test mode enable signal to said gate circuit.

28. In a method of operating a solid state electronic device of the type having an on die termination (ODT) circuit, the improvement comprising using only the ODT circuit to transmit a signal from the device.

* * * * *

UNITED STATES PATENT AND TRADEMARK OFFICE
CERTIFICATE OF CORRECTION

PATENT NO. : 7,574,634 B2  Page 1 of 1
APPLICATION NO. : 10/872608
DATED : August 11, 2009
INVENTOR(S) : Eric J. Stave It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1310 days.

Signed and Sealed this

Seventh Day of September, 2010

David J. Kappos
*Director of the United States Patent and Trademark Office*